United States Patent

Ho et al.

Patent Number: 5,693,983
Date of Patent: Dec. 2, 1997

[54] THIN-FILM STRUCTURE WITH CONDUCTIVE MOLYBDENUM-CHROMIUM LINE

[75] Inventors: Jackson H. Ho, Palo Alto; Robert R. Allen, deceased, late of San Francisco, by Jason Huynh, executor; Tzu-Chin Chuang, Saratoga, all of Calif.

[73] Assignee: Xerox Corporation, Stamford, Conn.

[21] Appl. No.: 235,008

[22] Filed: Apr. 28, 1994

[51] Int. Cl.$^6$ ................................................ H01L 23/532
[52] U.S. Cl. .................. 257/763; 257/764; 257/766; 257/775
[58] Field of Search .......................... 257/735, 741, 257/764, 766, 775, 59, 72, 763, 765, 915

[56] References Cited

U.S. PATENT DOCUMENTS

| | | | |
|---|---|---|---|
| 4,782,380 | 11/1988 | Shankar et al. | 357/71 |
| 4,942,441 | 7/1990 | Konishi et al. | 357/23.7 |
| 5,010,027 | 4/1991 | Possin et al. | 437/41 |
| 5,042,916 | 8/1991 | Ukae et al. | 359/59 |
| 5,121,236 | 6/1992 | Ukai et al. | 359/59 |
| 5,132,745 | 7/1992 | Kwasnick et al. | 357/4 |
| 5,132,819 | 7/1992 | Noriyama et al. | 359/58 |
| 5,162,931 | 11/1992 | Holmberg | 359/54 |
| 5,162,933 | 11/1992 | Kakuda et al. | 359/59 |
| 5,198,694 | 3/1993 | Kwasnick et al. | 257/766 |
| 5,223,961 | 6/1993 | Ukai et al. | 359/59 |
| 5,267,066 | 11/1993 | Nakai et al. | 359/67 |
| 5,279,980 | 1/1994 | Hikichi et al. | 437/40 |
| 5,324,674 | 6/1994 | Possin et al. | 437/41 |
| 5,486,939 | 1/1996 | Fulks | 359/74 |
| 5,491,347 | 2/1996 | Allen et al. | 257/59 |
| 5,518,805 | 5/1996 | Ho et al. | 428/213 |
| 5,528,082 | 6/1996 | Ho et al. | 257/775 |

FOREIGN PATENT DOCUMENTS

| | | | |
|---|---|---|---|
| 0209764 | 8/1989 | Japan | H01L 29/78 |

OTHER PUBLICATIONS

U.S. Patent Application No. 08/679,168 entitled Universal Display That Presents All Image Types With High Image Fidelity, filed on Jul. 12, 1996.

U.S. Patent Application No. 08/679,169 entitled Presenting An Image On A Display As It Would Be Presented By Another Image Output Device Or On Printing Circuitry, filed on Jul. 12, 1996.

U.S. Patent Application No. 08/234,098 entitled Digital Imaging System Using Two-Dimensional Input Sensor Array And Output Light Valve, filed on Apr. 28, 1994.

U.S. Patent Application No. 08/235,009 entitled Electronically Isolated Pixel Element In A Low Voltage Activated Active Matrix Liquid Crystal Display And Method, filed on Apr. 28, 1994.

U.S. Patent Application No. 08/234,896 entitled Digital Printer Using Two-Dimensional, Full Frame Light Valve, filed on Apr. 28, 1994.

U.S. Patent Application No. 08/664,096 entitled Thin-Film Structure With Tapered Feature, filed on Jun. 13, 1996.

U.S. Patent Application No. 08/688,976 entitled Dual Dielectric Capping Layers For Hillock Suppression In Metal Layers In Thin Film Structures, filed on Jul. 31, 1996.

(List continued on next page.)

*Primary Examiner*—Peter Toby Brown

[57] ABSTRACT

A conductive line in a thin-film structure such as an AMLCD array includes molybdenum and chromium so that it can be processed in a manner similar to chromium but has a greater conductivity than chromium due to the molybdenum. The conductive line can be produced by physical vapor deposition of a layer of a molybdenum-chromium (MoCr) alloy, which can then be masked and etched using photolithographic techniques in a manner similar to chromium. Proportions between 15 and 85 atomic percent of molybdenum can be processed more easily than pure molybdenum and are more conductive than pure chromium. Lines with between 40 and 60 atomic percent molybdenum can be used with a margin of error. To produce a tapered conductive line, sublayers of MoCr alloys with different etch rates can be produced and etched.

13 Claims, 6 Drawing Sheets

OTHER PUBLICATIONS

U.S. Patent Application No. 08/572,357 entitled Array With Metal Scan Lines Controlling Semiconductor Gate Lines, filed on Dec. 14, 1995.

U.S. Patent Application No. 08/367,984, entitled Circuitry With Gate Line Crossing Semiconductor Line At Two Or More Channels, filed on Jan. 3, 1995.

Martin, R., Chuang, T., Steemers, H., Allen, R., Fulks, R., Stuber, S., Lee, D., Young, M., Ho, J., Nguyen, M., Meuli, W., Fiske, T., Bruce, R., Thompson, M., Tilton, M., and Silverstein, L.D., "P–70: A 6.3–Mpixel AMLCD", *SID 93 Digest*, 1993, pp. 704–707.

European Search Report and Annex, Application No. EP 95 30 2512.

Kim, M. J., Saia, R.A., and Gorowitz, B., "Mo/Cr Metallization for Silicon Device Interconnection", J. Electrochem. Soc., vol.134, No. 6, Jun. 1987, pp. 1554–1558.

Dohjo, M., Aoki, T., Suzuki, K., Ikeda, M., Higuchi, T., and Oana, Y., "Low–Resistance Mo–Ta Gate–Line Material for Large–Area a–Si TFT–LCDs", *SID 88 Digest*, 1988, pp. 330–333.

Matino, H., Ichikawa, K., Yamaguchi, H., Hirano, S.–i., and Wisnieff, R.L., "Horizontal Stripe Color Arrangement for Large–Size TFT–LCD ", *SID 90 Digest*, 1990, pp. 400–403.

Ichikawa, K., Suzuki, S., Matino, H., Aoki, T., Higuchi, T., Oana, Y., "14.3–in.–Diagonal 16–Color TFT–LCD Panel Using A Si:H TFTs", *SID 93 Digest*, 1989, pp. 226–229.

Kobayashi, K., Hayama, M., Nakagawa, N., Ishibashi, T., Maejima, T., Yamazaki, T., "Fabrication of 10–in.–diagonal 16–gray–level TFT–LCDs by novel processing technologies", *Journal of the SID*, vol. 1, No.1, 1993, pp. 67–73.

Kwasnick et al. Reactive Ion Etched Moler Source–Drain Metallization for Amorphous Silicon Thin Film Transistors, Material Research Society Symposium Proceedings, vol.119, Apr. 30,–May 03, 1991, Anaheim, CA, pp. 357–362.

THIN-FILM STRUCTURE WITH CONDUCTIVE MOLYBDENUM-CHROMIUM LINE

BACKGROUND OF THE INVENTION

The present invention relates to thin-film structures.

Noriyama et al., U.S. Pat. No. 5,132,819, describe a liquid-crystal display device of active matrix type. As shown and described in relation to FIGS. 4 and 5, a chromium (Cr) film is formed by sputtering on the upper surface of an insulating substrate of glass or the like. The chromium film is photo-etched to form a gate electrode, an auxiliary capacitance line, and a conductor. A scanning line is formed integrally with the gate electrode. After several other features are formed, a molybdenum (Mo) film is formed, an aluminum (Al) film is formed on the Mo film, and the Mo-Al composite film is photo-etched to form a drain electrode, a source electrode, and a signal line (i.e. a column-selecting line).

Hikichi et al., U.S. Pat. No. 5,279,980, describe techniques for manufacturing a thin-film semiconductor device having an alpha-tantalum first wiring member. As described at col. 1 line 57-col. 2 line 5, first wiring members such as gate electrodes, source electrodes, drain electrodes, and signal wirings must be made of a conductive material that has good adhesion to a glass substrate and that is sufficiently heat-resistant to avoid deterioration in subsequent heat treatments. High-melting-point (refractory) metals such as tantalum (Ta), molybdenum (Mo), titanium (Ti), and chromium (Cr) have conventionally been used, with tantalum used most extensively. Col. 2 lines 15–23 indicates that tantalum alloys such as TaW and TaMo are used in some areas, but that a resulting anodic oxidation film will not contribute to a higher withstand voltage and that such alloys are less conductive than α-tantalum. Structures with TaMo alloys are shown and described in relation to FIGS. 1–9B.

SUMMARY OF THE INVENTION

The invention provides a thin-film structure at a surface of a substrate, and the thin-film structure includes a conductive line of molybdenum (Mo) and chromium (Cr).

The invention can be implemented by physical vapor deposition of Mo and Cr such that the resulting molybdenum-chromium (MoCr) layer can be processed in somewhat the same way as if it were Cr, yet has greater conductivity than pure Cr. Mo and Cr can be sputtered from separate Mo and Cr targets by moving the substrate past the targets in succession. Or both Mo and Cr can be sputtered from a single alloy target. After an MoCr layer is formed, a pattern of mask material can be formed using lithographic techniques, and an etch can remove areas not covered by the pattern. The pattern includes a part that has the shape of a conductive line covering a part of the MoCr layer, so that the covered part forms an MoCr conductive line. Then the mask material can be removed from over the conductive line.

Tests have shown that an MoCr layer can be wet etched similarly to Cr. Tests have also shown that an MoCr layer with 50 percent molybdenum or less is, like Cr, unaffected by cleaning with a solution containing $NH_4OH$ and $H_2O_2$, a solution that would remove a pure Mo layer. Pure Mo, on the other hand, is subject to severe attack by many etchants commonly used in producing thin-film structures, including etchants for silicon such as a solution containing $H_3PO_4$, $HNO_3$, and HF and etchants for aluminum such as $H_3PO_4$, $CH_3COOH$, and $HNO_3$ and also $H_2SO_4$ and $H_2O_2$.

Many different atomic proportions of Mo and Cr would form a layer that can be processed more easily than pure Mo but has greater conductivity than pure Cr. Tests have shown that a layer with any proportion between 15 and 85 atomic percent of molybdenum meets this criterion. In practical applications, conductive lines with between 40 and 60 atomic percent molybdenum can be used with a satisfactory margin of error. The invention has been implemented with conductive lines that include approximately 40 to 60 atomic percent molybdenum with the balance being chromium.

In addition, different atomic proportions of Mo and Cr can be used to produce MoCr layers with different etch rates. The etching process can then produce a tapered MoCr line, greatly reducing problems with step coverage even for a relatively thick conductive line.

MoCr conductive lines according to the invention can be scan lines in an array of light control units for an active matrix liquid crystal display (AMLCD). Each light control unit can include a thin-film transistor (TFT), and each conductive line can, for example, be a scan line for providing signals to the gates of a set of the TFTs. Each scan line can be connected, for example, to the TFTs in a row of light control units.

The invention is advantageous compared to several conventional techniques:

In comparison with Cr lines on an insulating substrate, MoCr alloy lines can be etched similarly but have lower sheet resistivity and film stress, allowing thicker films, which in turn shortens RC delay time. A typical 1000 Å thick sputter deposited Cr film has sheet resistivity in the range of 10 to 30 ohms/sq. depending on deposition conditions. Cr films deposited at higher argon (Ar) gas pressure have lower stress and therefore are less susceptible to film cracking during subsequent processing; unfortunately, such films also have higher resistivity. In contrast, a film of MoCr alloy deposited under normal sputtering conditions has much lower film stress and resistivity: A 1000 Å thick MoCr film has been successfully fabricated with close to zero stress and less than 3 ohms/sq. As array size increases, MoCr alloy lines perform better than Cr lines because MoCr has lower resistance and therefore lower RC delay. The MoCr alloy system permits fine tuning of some properties by changing alloy composition-film stress, wet etch rate in Cr etch, and resistance to some other chemical etchants are examples of properties that can be fine tuned. In addition, the MoCr alloy system can be varied within a layer to provide different etch rates, permitting tapered edges.

In comparison with Al lines, MoCr is a high temperature refractory metal, so that it can sustain high temperature processing such as 300°–400° C., the typical range for chemical vapor dielectric deposition in display fabrication. Al, on the other hand, forms hillocks in high temperature processing. Hillocks are a major cause of device failure when Al lines are used.

In comparison with Mo-Ta alloy lines, MoCr lines can be produced using wet etch techniques applicable to Cr, while Mo-Ta lines can only be produced using dry etch processes such as plasma etching, which are expensive and often have uniformity problems.

MoCr lines are also advantageous because the MoCr alloy system improves performance of a large area active matrix display.

The following description, the drawings, and the claims further set forth these and other aspects, objects, features, and advantages of the invention.

DETAILED DESCRIPTION

A. Conceptual Framework

The following conceptual framework is helpful in understanding the broad scope of the invention, and the terms defined below have the indicated meanings throughout this application, including the claims.

"Circuitry" or a "circuit" is any physical arrangement of matter that can respond to a first signal at one location or time by providing a second signal at another location or time, where the second signal includes information from the first signal. Circuitry "stores" a first signal when it receives the first signal at one time and, in response, provides the second signal at another time. Circuitry "transfers" a first signal when it receives the first signal at a first location and, in response, provides the second signal at a second location.

A signal "indicates" or "selects" one of a set of alternatives if the signal causes the indicated one of the set of alternatives to occur.

Any two components are "connected" when there is a combination of circuitry that can transfer signals from one of the components to the other. For example, two components are "connected" by any combination of connections between them that permits transfer of signals from one of the components to the other. Two components are "electrically connected" when there is a combination of circuitry that can transfer electric signals from one to the other.

An "electric circuit" is a circuit within which components are electrically connected. An "electric structure" is a physical structure that includes one or more electric circuits.

A "substrate" or "chip" is a unit of material that has a surface at which circuitry can be formed or mounted. An "insulating substrate" is a substrate through which no electric current can flow.

A "layer" is a thickness of material formed over a surface and extending generally parallel to the surface, with one side toward the surface and another side away from the surface. A layer may include two or more layers within it, referred to as "sublayers." A layer may be homogeneous or its composition may vary.

To "etch" is to remove parts of one or more layers of material. To "wet etch" is to etch using liquid chemical reactions. To "dry etch" is to use gas-phase reactants, inert or active ionic species, or a mixture of these to etch by chemical processes, physical processes, or a mixture of these, respectively.

To perform "physical vapor deposition" is to cause a material to be deposited on a physical structure without a chemical reaction. Examples include sputtering, vacuum evaporation, and e-beam deposition.

To "sputter from" a solid material is to bombard the solid material with energetic ions so that atoms from the solid material are dislodged by direct momentum transfer, making it possible to deposit the dislodged atoms elsewhere. The solid material may be referred to as a "target."

To perform "lithography" is to use a radiation source to transfer a mask pattern to a layer of radiation-sensitive material and then to develop the radiation-sensitive material to obtain a positive or negative copy of the mask pattern. The transferred pattern that results from development may be referred to as a "pattern of mask material" if it is to be used for etching.

An "alloy" is a material that is a macroscopically homogeneous mixture of two or more metals.

In an alloy or other mixture of two or more elements, the relationship between the quantities of atoms of the elements can be expressed as an "atomic percent," an "atomic proportion," or an "atomic ratio."

"MoCr" or "molybdenum-chromium" means an alloy that includes molybdenum and chromium. MoCr could also include traces of one or more additional metals which do not affect film properties.

A "thin-film structure" is a physical structure that is formed from layers of material at a surface of a substrate. A thin-film structure could be formed, for example, by deposition and patterned etching of films on the substrate's surface.

During production of a thin-film structure at a surface, a part of a first layer "covers" or "has a shape that covers" or "is over" a part of a second layer if the part of the second layer is between the part of the first layer and the surface.

An "integrated circuit" is a circuit formed at a substrate's surface by batch processes such as deposition, lithography, etching, oxidation, diffusion, implantation, annealing, and so forth.

A "lead" is a part of a component at which the component is electrically connected to other components. A "conductive line" or "line" is a simple conductive component that extends between and electrically connects two or more leads. A lead of a component is "connected" to a lead of another component when the two leads are electrically connected by a combination of leads and lines. In an integrated circuit, leads of two components may also be "connected" by being formed as a single lead that is part of both components.

During production of a thin-film structure, a part of a layer has "the shape of a conductive line" if the part is shaped so that it could extend between and electrically connect two or more leads of components in the completed thin-film structure.

In a thin-film structure formed at a surface, a conductive line is "formed on" the surface if the thin-film structure does not include any films between the conductive line and the surface.

A "channel" is a part of a component through which electric current can flow. A channel is "conductive" when the channel is in a state in which current can flow through it.

A "channel lead" is a lead that connects to a channel. A channel may, for example, extend between two channel leads.

A "transistor" is a component that has a channel that extends between two channel leads, and that also has a third lead-preferred to as a "gate lead" or simply "gate"—such that the channel can be switched between high impedance and low impedance by signals that change potential difference between the gate and one of the channel leads, referred to as the "source." The channel lead that is not the source is referred to as the "drain." Other components may have leads called gates, sources, and drains by analogy to transistors.

A "thin-film transistor" or "TFT" is a transistor that is part of a thin-film structure. The term "thin-film transistor" includes transistors with multiple gates.

An "image" is a pattern of physical light.

When an image is a pattern of physical light in the visible portion of the electromagnetic spectrum, the image can produce human perceptions. The term "graphical feature", or "feature", refers to any human perception produced by, or that could be produced by, an image.

An image may be divided into "segments," each of which is itself an image. A segment of an image may be of any size up to and including the whole image.

"Image output circuitry" is circuitry for providing data defining images as output.

An "image output device" is a device that can provide output defining an image.

"Display circuitry" is circuitry that can receive data defining a sequence of images and present versions of the images in sequence so that a viewer can perceive the versions of the images in sequence. A "display" is an image output device that includes display circuitry. Display circuitry or a display may, for example, include a cathode ray tube; an array of light emitting, reflecting, or absorbing elements; a structure that presents sequences of images on a screen, paper, or another medium; or any other structure capable of presenting sequences of images in response to data that define them. To "present an image" on display circuitry or a display is to operate the display circuitry or display so that a viewer can perceive the image.

A "segment of images" presented by a display is at the same relative position within all the images.

Circuitry or a circuit "causes presentation of a segment" or "presents a segment" of images if the segment is presented in response to the circuitry or circuit.

A "light control unit" is a part of display circuitry that is structured to receive a signal and to respond to its signal by causing presentation of an image segment with one of a set of colors.

An "array of light control units" is an arrangement of light control units that can cause presentation of segments that together form an image. An array of light control units can, for example, extend in first and second directions that are perpendicular, forming rows and columns.

The "area" of an array of light control units that extends in first and second directions is the product of the array's extent in the first direction and its extent in the second direction.

B. General Features

Figure 1:
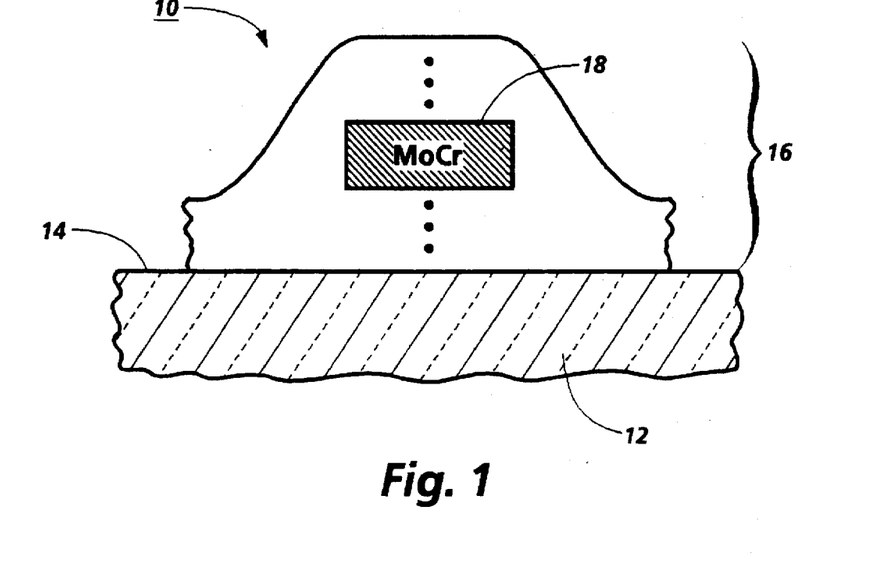
FIG. 1 is a schematic diagram showing a thin-film structure that includes a molybdenum-chromium conductive line.
Figure 2:
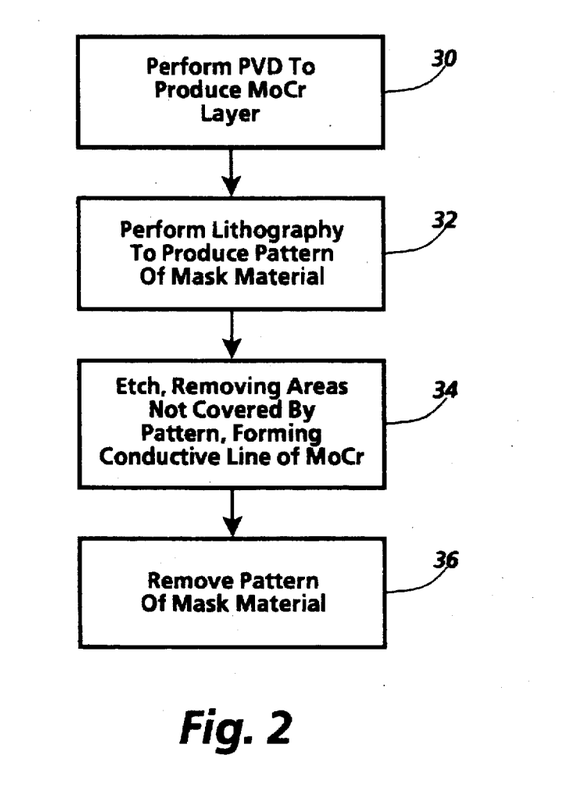
FIG. 2 is a flow chart showing general acts in producing an MoCr conductive line as in FIG. 1.

FIGS. 1 shows a thin-film structure that includes a molybdenum-chromium (MoCr) conductive line. FIG. 2 shows general acts in producing an MoCr conductive line.

Product 10, shown in cross-section in FIG. 1, includes substrate 12 with surface 14 at which thin-film structure 16 is formed. Thin-film structure 16 includes conductive line 18, which in turn includes molybdenum-chromium. Conductive line 18 could be on surface 14 but, as suggested by the ellipses in FIG. 1, thin-film structure 16 can also include one or more layers between MoCr conductive line 18 and surface 14. Thin-film structure 16 can also include one or more layers above MoCr conductive line 18.

In FIG. 2, the act in box 30 begins by performing physical vapor deposition (PVD) to produce a layer that includes molybdenum-chromium. The act in box 32 performs lithography to produce a pattern of mask material that covers a part of the MoCr layer that has the shape of a conductive line. The act in box 34 then etches to remove areas not covered by the pattern of mask material from box 32. As a result of the etch in box 34, the covered part of the MoCr layer forms an MoCr conductive line. The act in box 36 then removes the pattern of mask material from the MoCr conductive line.

C. Implementation

The general features described above could be implemented in numerous ways to provide a thin-film structure with an MoCr conductive line. As described below, the general features have been implemented in a number of ways. A product that includes MoCr conductive lines according to one of the implementations described below is also described in Martin, R., Chuang, T., Steemers, H., Allen, R., Fulks, R., Stuber, S., Lee, D., Young, M., Ho, J., Nguyen, M., Meuli, W., Fiske, T., Bruce, R., Thompson, M., Tilton, M., and Silverstein, L. D., "P-70: A 6.3-Mpixel AMLCD," SID 93 *Digest*, 1993, pp. 704–707.

C. 1. Array

Figure 3:
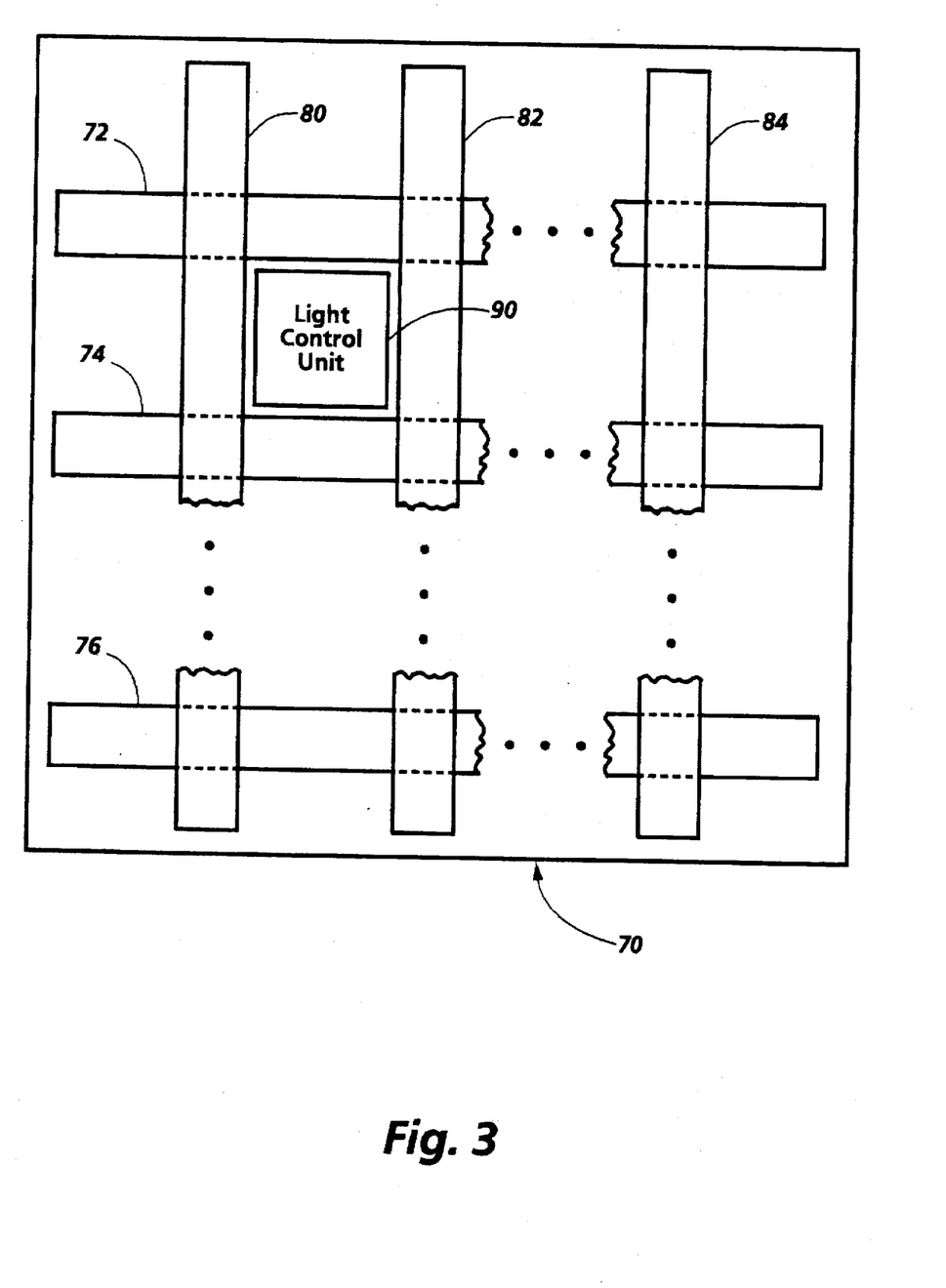
FIG. 3 is a schematic plan view of a layout of an array of light control units with MoCr conductive lines.
Figure 4:
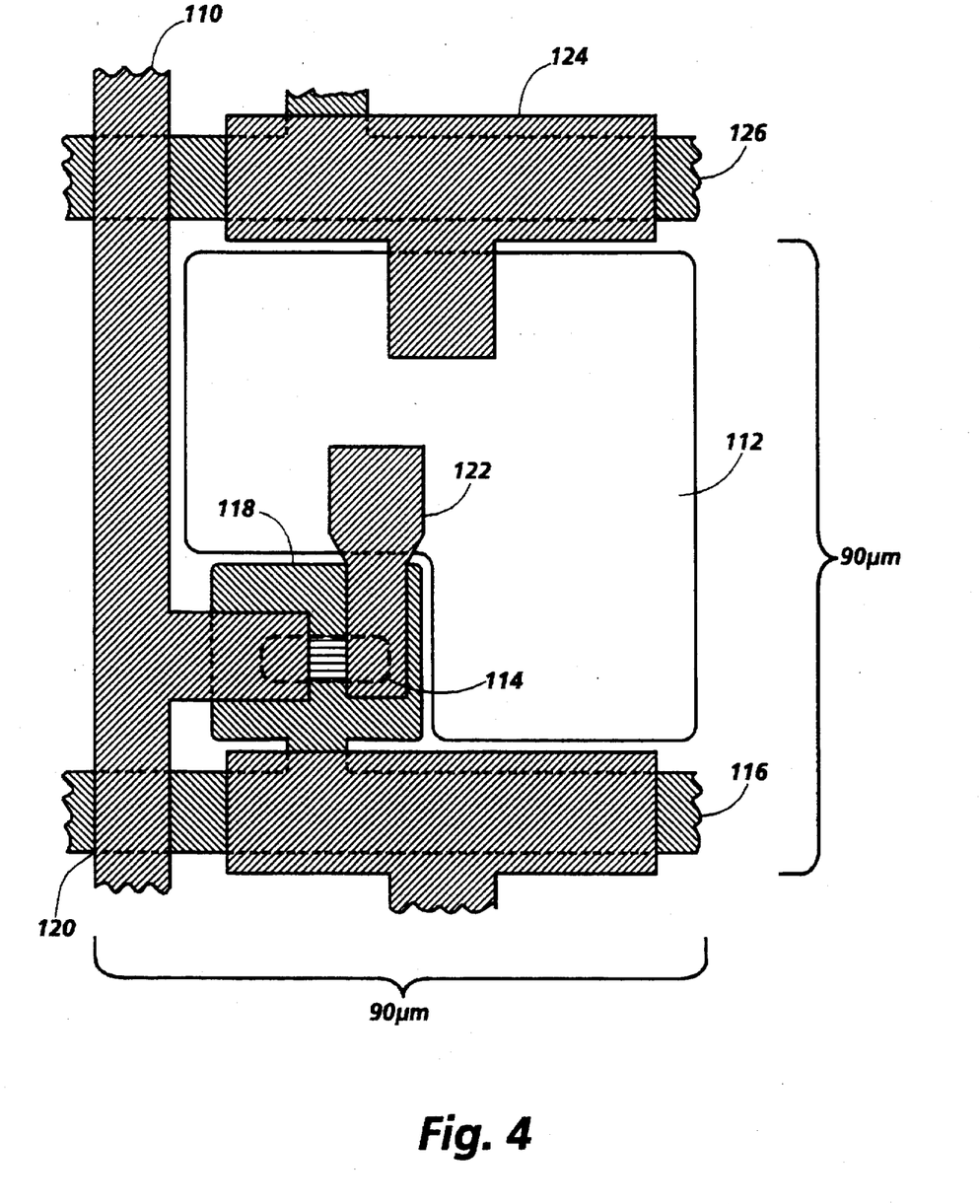
FIG. 4 is a plan view of a layout of a light control unit in an implementation of the array of FIG. 3.

FIG. 3 shows a partial layout of an array with MoCr scan lines. FIG. 4 shows a layout of a light control unit in the array of FIG. 3.

Array 70 in FIG. 3 includes scan lines 72, 74, through 76 and data lines 80, 82, through 84. Scan lines 72, 74, through 76 are MoCr conductive lines, with scan lines 74 through 76 each connected to a row of light control units to provide a signal selecting the light control units in that row. Illustrative light control unit 90, for example, receives its signal from scan line 74.

In some implementations, each light control unit in array 70 could receive a binary scan signal from its scan line, so that the light control unit is either selected or not, as described in copending, coassigned U.S. patent application No. 08/235,011, now issued as U.S. Pat. No. 5,491,3, entitled "Thin-Film Structure With Dense Array of Binary Control Units for Presenting Images" ("the Array Application"), incorporated herein by reference. Therefore, conductivity of scan lines is important-as conductivity declines, the scan signal becomes damped and delayed. MoCr conductive lines provide sufficient conductivity to alleviate this problem. The Array Application describes a working implementation that employs MoCr conductive lines.

FIG. 4 shows a light control unit implemented in accordance with the Array Application. FIG. 4 shows several layers of a thin-film structure, with upper layers that are farthest from the substrate's surface obscuring lower layers.

The uppermost layer shown in FIG. 4 is a top metal layer, which forms data line 110 connected to a channel lead of a transistor in the light control unit; the top metal layer also forms several other features described below. The next layer shown is a layer of indium-tin-oxide (ITO), which forms transparent electrode 112. The next layer is a top nitride layer, which forms island 114, part of the transistor. The lowest layer shown is an MoCr layer, which forms gate line 116 and, connected to it, gate lead 118, which serves as the gate lead of the transistor.

Data line 110 can be implemented with a resistance of 0.2 ohm/sq. and can be driven at −8 V, 0 V, and +8 V. Data line 110 provides a data signal to a column of binary control units, one of which is shown in FIG. 4. The part of data line 110 that extends over gate lead 118 connects to the source lead of the transistor.

Gate line 116 similarly provides a scan signal to a row of binary control units. Gate line 116 can be implemented with a resistance of 1.40 hm/Sq and can be driven at +15 V and −15 V.

Data line 110 and gate line 116 are each 10 µm wide. Data line 110 crosses over gate line 116 in crossover region 120. Crossover region 120 can include an insulator formed by the top nitride layer, and other features as necessary to ensure that the two lines conduct signals adequately and that signals in the two lines do not interfere.

Transparent electrode 112 connects to the drain lead of the transistor through drain line 122, formed by the top metal layer. Therefore, when the transistor is conductive due to a scan signal provided to gate lead 118 by gate line 116, transparent electrode 112 receives and stores a drive signal from data line 110 through drain line 122.

Transparent electrode 112 also connects to charging lead 124, which implements one electrode of a storage capacitor and is formed by the top metal layer. Gate line 126, formed by the MoCr layer, implements the other electrode of the storage capacitor; gate line 126 also provides a scan signal to the preceding binary control unit in the same column.

The Array Application describes in greater detail how array 70 can be implemented.

C.2. Two Target Process

Figure 5:
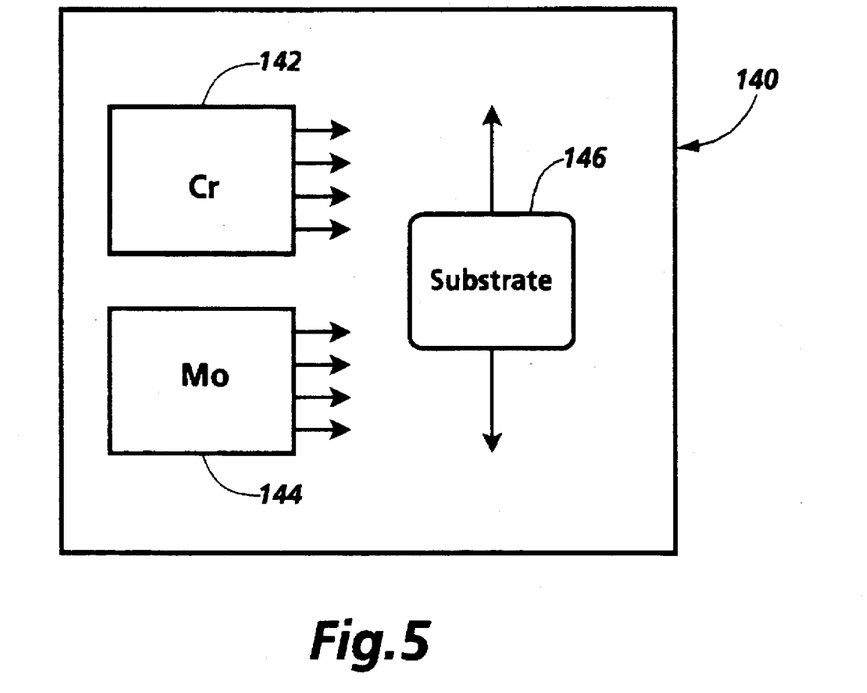
FIG. 5 is a schematic view of a sputtering chamber with a molybdenum target and a chromium target.
Figure 6:
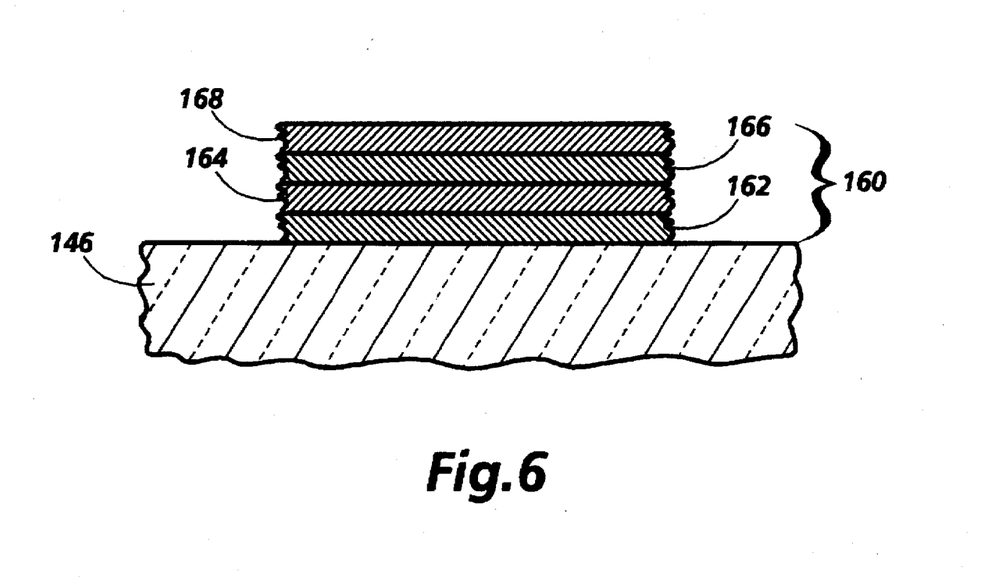
FIG. 6 is a cross-section of an MoCr layer produced in the sputtering chamber of FIG. 5.

FIG. 5 shows how two targets can be used to produce an MoCr layer. FIG. 6 illustrates an MoCr layer produced as in FIG. 5.

Chamber 140 in FIG. 5 can be the vacuum chamber of a conventional magnetron sputtering machine. In chamber 140 are target 142, a pure chromium target, and target 144, a pure molybdenum target. Substrate 146 is within chamber 140, mounted so that it can be moved back and forth between a first position adjacent target 142 for deposition of chromium and a second position adjacent target 144 for deposition of molybdenum. Sputtering can be performed using conventional techniques.

FIG. 6 shows layer 160 formed on substrate 146. Layer 160 can be 1500 angstroms thick, for example, and illustratively includes four very thin sublayers 162, 164, 166, and 168. Sublayers 162 and 166, for example, can be chromium, while sublayers 164 and 168 can be molybdenum. The sublayer on substrate 146 could be either molybdenum or chromium, as long as it adheres to substrate 146.

If the sublayers in layer 160 are sufficiently thin, layer 160 forms an MoCr alloy due to mixing of chromium and molybdenum atoms. The technique illustrated in FIGS. 5 and 6 has been used successfully to produce an array as illustrated in FIG. 3.

C.3. Single Target Process

Figure 7:
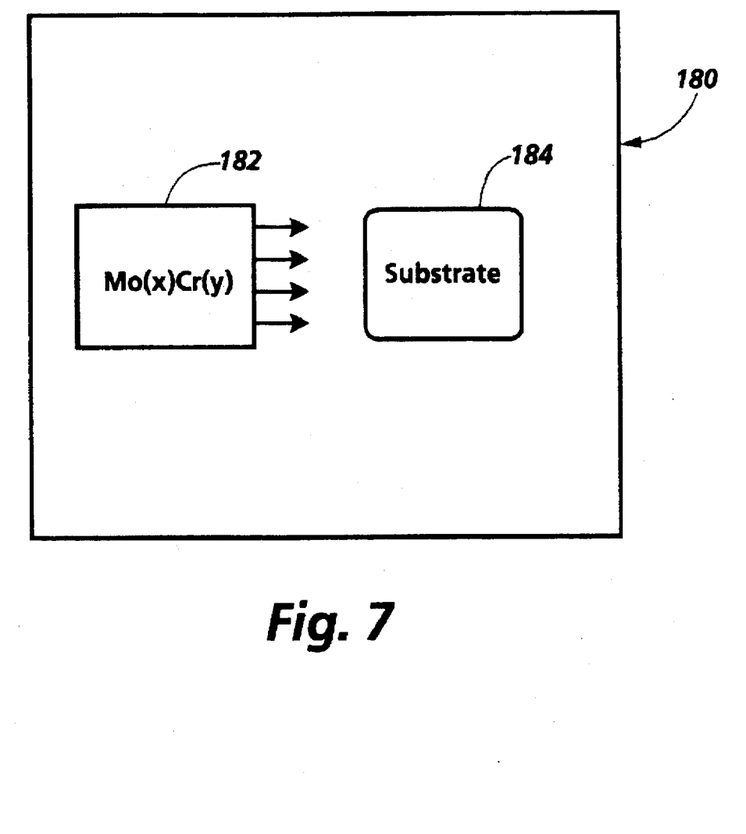
FIG. 7 is a schematic view of a sputtering chamber with a molybdenum-chromium alloy target.

FIG. 7 illustrates how a more uniform MoCr layer can be produced. The technique in FIG. 7 is the same as in FIG. 5, but with a single metal target rather than two targets.

In chamber 180 in FIG. 7 are target 182, an Mo(x)Cr(y) alloy target in which x/y is the atomic ratio of Mo to Cr. Substrate 184 is also within chamber 180, mounted so that sputtering can be performed to transfer atoms from target 182 to substrate 184 in the conventional manner.

Mo(x)Cr(y) alloy targets were not available in the past, apparently because such targets were not used in producing thin-film structures through sputtering. As a result of the success of this invention, however, such targets have become available from a number of sources, including Material Research Corporation, Orangeburg, N.Y.

The technique of FIG. 7 has also been used successfully to produce an array as illustrated in FIG. 3. After production of an MoCr layer, etching and other operations can be performed using conventional techniques for obtaining chromium conductive lines. Proportions of 40 to 60 atomic percent molybdenum and 60 to 40 atomic percent chromium have produced MoCr conductive lines with the desired properties of etchability and conductivity.

C.4. Taper Process

Figure 8:
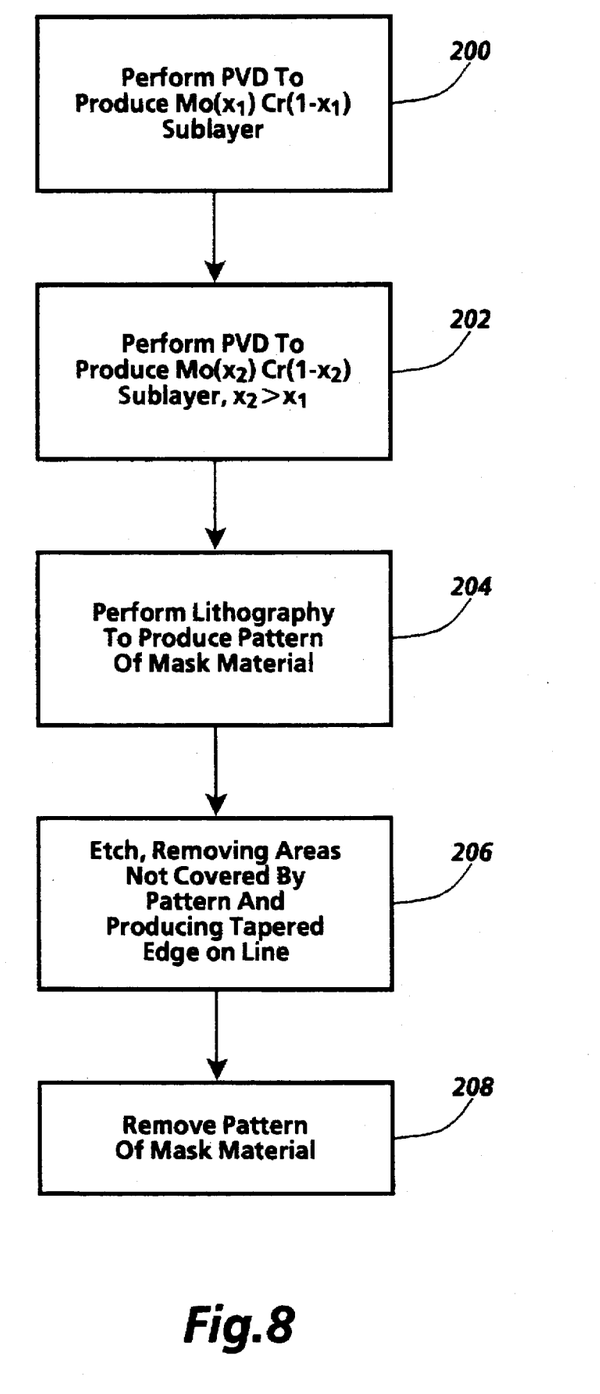
FIG. 8 is a flow chart showing acts in producing a tapered conductive line that includes molybdenum and chromium.
Figure 9:
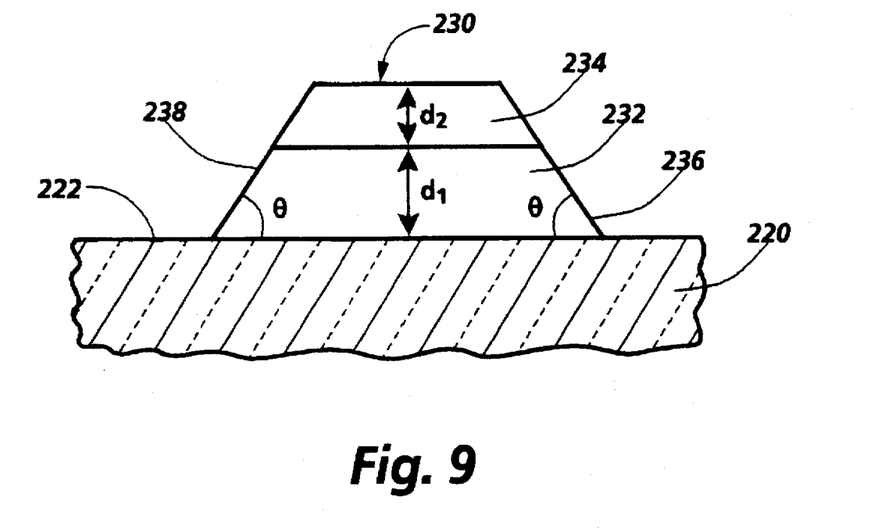
FIG. 9 is a schematic cross-section showing a tapered conductive line produced as in FIG. 8.

FIG. 8 shows act in producing a tapered MoCr conductive line. FIG. 9 shows a cross section of a tapered MoCr conductive line produced as in FIG. 8.

In FIG. 8, the act in box 200 begins by performing physical vapor deposition (PVD) to produce a first sublayer that includes $Mo(x_1)Cr(1-x_1)$, an alloy in which $x_1$ is the atomic percentage of Mo and $(1-x_1)$ is the atomic percentage of Cr. The act in box 202 then performs physical vapor deposition (PVD) to produce a second sublayer that includes $Mo(x_2)Cr(1-x_2)$, where $x_1>x_2$ so that the the etch rate of the second sublayer is significantly faster than the etch rate of the first. Together the first and second sublayers form a layer that include molybdenum and chromium, with each sublayer including an MoCr alloy.

The act in box 204 performs lithography to produce a pattern of mask material that covers a part of the layer of molybdenum and chromium that has the shape of a conductive line. The act in box 206 then etches to remove areas not covered by the pattern of mask material from box 204. As a result of the etch in box 206, the covered part of the MoCr layer forms a conductive line that includes molybdenum and chromium. In addition, the act in box 206 etches differentially under the pattern boundary to produce a tapered edge on the conductive line. The act in box 208 then removes the pattern of mask material from the conductive line.

FIG. 9 illustrates a conductive line formed using acts like those in FIG. 8. The conductive line is formed on substrate 220, which has surface 222 at which a thin-film structure can be formed.

Conductive line 230 is formed on surface 222, with lower sublayer 232 being a thickness of $d_1$ of $Mo(x_1)Cr(1-x_1)$ and upper sublayer 234 being a thickness of $d_2$ of $Mo(x_2)Cr(1-x_2)$, where $x_1>x_2$. By choosing appropriate values, conductive line 230 can be formed with a desired etch rate ratio R of the etch rate of upper sublayer 234 over the etch rate of lower sublayer 232, such that $1<R<3$. For example, $x_1$ can be 83, $d_1$ 4600 angstroms, $x_2$ 87, and $d_2$ 400 angstroms, producing an etch rate ratio R=2.5. The etch rate ratio and the thicknesses of the sublayers also determine the taper angle θ, so that both edge 286 and edge 238 of conductive line 230 are at an angle θ from surface 222. Conductive line 230 is thus 5000 angstroms thick.

Techniques for producing tapered conductive lines are set forth in more detail in copending, coassigned U.S. patent application No. 08/235,010, now issued as U.S. Pat. No. 5,528,082, entitled "Thin-Film Structure With Tapered Feature," incorporated herein by reference.

C.5. Variations

The implementations described above use sputtering to deposit chromium and molybdenum. Other physical vapor deposition techniques could be used, such as vacuum evaporation and e-beam deposition.

The implementations described above use particular atomic proportions of molybdenum and chromium, but other atomic proportions within the ranges described above could be used. Further, the implementations described above use alloys that include only molybdenum and chromium, but it may be possible to add small atomic proportions of other metals without reducing the desirable properties of MoCr conductive lines.

The implementations described above include implementations in which an MoCr layer is homogeneous or includes sublayers. Other internal structures that result in an MoCr alloy could be used.

The implementations described above generally form an MoCr layer on a glass substrate. For a top gate structure, however, the MoCr layer could be formed on a polysilicon layer rather than on the substrate, and the substrate could be an insulating material other than glass.

The implementations described above employ specific process steps in a specified order. It may be possible to implement the invention with steps in different orders or with other process steps.

D. Application

The invention could be applied in many ways, including production of an array for an active matrix liquid crystal display (AMLCD), as described in the Array Application. For example, it may be possible to use the invention in producing a scanning array with a thin-film structure or another structure with conductive lines that connect leads of components.

AMLCDs in which the invention has been applied have provided good overall performance. An implementation with approximately 6.3 million light control units has performed surprisingly well.

E. Miscellaneous

Although the invention has been described in relation to various implementations, together with modifications, variations, and extensions thereof, other implementations, modifications, variations, and extensions are within the scope of the invention. The invention is therefore not limited by the description contained herein or by the drawings, but only by the claims.

What is claimed:

1. A product comprising:
    a glass substrate that has a surface: and
    a thin-film structure formed at the surface of the glass substrate; the thin-film structure comprising:
        a conductive line comprising a mixture of metals that includes molybdenum and chromium; the mixture of metals being metal, alloy and, wherein the metal alloy has sufficient molybdenum to have a conductivity greater than pure chromium, the metal alloy has sufficient chromium to resist chemical attack by a liquid that includes any of $H_3PO_4$, $HNO_3$, $HF$, $CH_3COOH$, or $H_2SO_4$ and therefore would severely attack pure molybdenum, the metal alloy comprises between 15 and 85 atomic percent molybdenum.

2. The product of claim 1 in which the conductive line comprises between 40 and 60 atomic percent molybdenum.

3. The product of claim 1 in which the conductive line comprises approximately 40 atomic percent molybdenum and approximately 60 atomic percent chromium.

4. The product of claim 1 in which the conductive line has a base side on the surface of the substrate and a top side facing away from the substrate; the conductive line having a base width across the base side and a top width across the top side; the conductive line being tapered from the base side to the top side so that the base width is greater than the top width.

5. The product of claim 1 in which the substrate is an insulator; the conductive line being formed on the surface of the substrate.

6. The product of claim 1 in which the conductive line has a base side on the surface of the substrate and a top side facing away from the substrate; the conductive line having a base width across the base side and a top width across the top side; the conductive line being tapered from the base side to the top side so that the base width is greater than the top width.

7. A product comprising:
    a glass substrate that has a surface; the glass substrate being an insulator; and a thin-film structure formed at the surface of the substrate; the thin-film structure comprising:
    a conductive line formed on the surface of the substrate; the conductive line having a base side on the surface of the substrate and a top side facing away from the substrate; the conductive line having a base width across the base side and a top width across the top side; the conductive line being tapered from the base side to the top side so that the base width is greater than the top width; the conductive line comprising:
        a first layer that includes a first mixture of metals including molybdenum and chromium; the first mixture being metal alloy; the first mixture having a first atomic ratio of molybdenum to chromium; and
        a second layer that includes a second mixture of metals including molybdenum and chromium; the second mixture being metal alloy; the second mixture having a second atomic ratio of molybdenum to chromium; the second layer being between the first layer and the top side of the conductive line; the second atomic ratio being greater than the first atomic ratio.

8. A product comprising:
    a glass substrate that has a surface; and
    a thin-film structure formed at the surface of the glass substrate; the thin-film structure comprising:
    an array of light control units for causing presentation of images; each light control unit having a lead for receiving a unit signal; each light control unit responding to its unit signal by causing presentation of a segment of images presented by the array; and
    two or more conductive lines, each comprising a mixture of metals that includes molybdenum and chromium; the mixture of metals in each conductive line being metal alloy; the metal alloy in each conductive line including between 15–85 atomic percent molybdenum such that the conductive line has a conductivity greater than pure chromium; the metal alloy in each conductive line including sufficient chromium that the conductive line resists chemical attack by a liquid that includes any of $H_3PO_4$, $HNO_3$, $HF$, $CH_3COOH$, or $H_2SO_4$ and that therefore would severely attack pure molybdenum;
    each conductive line being connected to the lead of each of a set of the light control units for providing a unit signal to the light control units in the set.

9. The product of claim 8 in which the array has a diagonal dimension of approximately 33 cm and an area of approximately 510 cm$^2$.

10. The product of claim 8 in which each light control unit's unit signal can be provided at either of first or second levels.

11. The product of claim 8 in which each light control unit comprises:

a thin-film transistor having a gate lead; the gate lead being the lead for receiving the unit signal; the unit signal provided by each conductive line selecting the light control units in the set connected to the conductive line;

the light control units in the array forming rows and columns, each row extending in a first direction and each column extending in a second direction;

the set of light control units connected to each conductive line including the light control units in a row.

12. The product of claim 8, further comprising a display; the array of light control units causing presentation of images by the display.

13. A product comprising:

a glass substrate that has a surface: and a thin-film structure formed at the surface of the glass substrate; the thin-film structure comprising:

a conductive line comprising a mixture of metals that includes molybdenum and chromium; the mixture of metals being a metal alloy; and, wherein the metal alloy metal alloy has sufficient molybdenum to have a conductivity greater than pure chromium, the metal alloy has sufficient chromium to resist chemical attack by a liquid that includes any of $H_3PO_4$, $HNO_3$, HF, $CH_3COOH$, or $H_2SO_4$ and therefore would severely attack pure molybdenum, and the metal alloy includes first and second sublayers; the first sublayer including a first metal alloy of molybdenum and chromium; the second sublayer including a second metal alloy of molybdenum and chromium; the first and second metal alloys having different proportions of molybdenum.

* * * * *